United States Patent
Bendel et al.

(10) Patent No.: US 8,244,765 B2
(45) Date of Patent: Aug. 14, 2012

(54) AVOIDING THREE-VALUED LOGIC IN PREDICATES ON DICTIONARY-ENCODED DATA

(75) Inventors: Peter Bendel, Boeblingen (DE); Oliver Draese, IBoeblingen (DE); Vijayshankar Raman, San Jose, CA (US); Knut Stolze, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 323 days.

(21) Appl. No.: 12/570,420

(22) Filed: Sep. 30, 2009

(65) Prior Publication Data

US 2011/0078134 A1     Mar. 31, 2011

(51) Int. Cl.
*G06F 17/00* (2006.01)
(52) U.S. Cl. ......... 707/791; 707/802; 707/822; 707/828
(58) Field of Classification Search ........... 707/600–831
See application file for complete search history.

(56) References Cited

U.S. PATENT DOCUMENTS
6,014,656 A * 1/2000 Hallmark et al. .................... 1/1

FOREIGN PATENT DOCUMENTS
WO         WO 9520792         8/1995

OTHER PUBLICATIONS

Anonymous, "Null (SQU)", http://en.wikipedia.org/wiki/Null_(SQL); Jan. 15, 2009.
Mullins, "Using Nulls in DB2", http://www.db2portal.com/2006/04/using-nulls-in-db2.html; Apr. 22, 2006.

* cited by examiner

*Primary Examiner* — Issac M Woo
(74) *Attorney, Agent, or Firm* — Patterson & Sheridan, LLP

(57) ABSTRACT

According to one embodiment of the present invention, a method for dictionary encoding data without using three-valued logic is provided. According to one embodiment of the invention, a method includes encoding data in a database table using a dictionary, wherein the data includes values representing NULLs. A query having a predicate is received and the predicate is evaluated on the encoded data, whereby the predicate is evaluated on both the encoded data and on the encoded NULLs.

12 Claims, 4 Drawing Sheets

| Column |
|---|
| 'some string' |
| 'another string' |
| 'some string' |
| NULL |
| 'some string' |
| 'yet another string' |
| 'some string' |

FIG. 1

| NULL indicator | Column |
|---|---|
| 0x00 | 1 |
| 0x00 | 2 |
| 0x00 | 1 |
| 0XFF | N/A |
| 0x00 | 1 |
| 0x00 | 3 |
| 0x00 | 1 |

FIG. 2

| Index | Data |
|---|---|
| 1 | 'some string' |
| 2 | 'another string' |
| 3 | 'yet another string' |

FIG. 3

| Column |
|---|
| 1 |
| 2 |
| 1 |
| 4 |
| 1 |
| 3 |
| 1 |

FIG. 4

| Index | Data |
|---|---|
| 1 | 'some string' |
| 2 | 'another string' |
| 3 | 'yet another string' |
| 4 | NULL |

FIG. 5

AVOIDING THREE-VALUED LOGIC IN PREDICATES ON DICTIONARY-ENCODED DATA

BACKGROUND

The present invention relates to database systems, and more specifically, to the processing of database tables having NULLS.

Relational database management systems require that a marker be present to indicate that a data value does not exist or is inapplicable. In Structured Query Language (SQL) this marker is called a NULL. An example of a missing value may occur when a table in a database stores customer-related information like the first name, last name, and address of each customer. Some customers may additionally have a middle name or middle initial—while others may not. For these cases, using NULLs can be a way to express that a customer does not have a middle initial. Other examples for unknown values could be missing phone/fax numbers or email addresses.

Besides unknown information, another typical situation where NULLs are used is if a value is not even applicable. For example, the date when someone was on maternity leave is applicable for females, but not for males.

NULLs are not considered to be values of the domain of the data, i.e. NULL is not a string or integer. The introduction of such NULLs leads to so-called three-valued logic. The reason is that only values in the same (or a compatible) domain can be compared with each other and give a well-defined result. The comparison is either "true" or "false". However, comparing a value with NULL always results in a third value, "unknown". For example, comparing "1=1" is "true"; "10<9" is "false"; but "1=NULL" is "unknown" because the actual value for which NULL was used is unknown (or not applicable).

Current database systems are the primary exploiters and implementers of three-valued logic. One can write a query like the following:
 SELECT *
 FROM customers
 WHERE phone_number='1-800-123-4567'
This query finds all customers with that particular phone number. All customers with other phone numbers (or with an "unknown" phone number) are excluded from the result set.

SUMMARY

According to one embodiment of the present invention, a method comprises: encoding data in a database table using a dictionary, wherein the data includes values representing NULLs; receiving a query having a predicate; and evaluating the predicate on the encoded data, whereby the predicate is evaluated on both the encoded data and on the encoded NULLs.

According to another embodiment of the present invention, a method comprises: encoding data in a database table using a dictionary, wherein the data includes values representing NULLs; receiving a query having a predicate; if the predicate is a range predicate, rewriting the bounds of the range of the range predicate so as to exclude the embedded value representing NULLs; if the predicate includes a NOT operator, rewriting the predicate into an equivalent expression that does not contain a NOT expression; and evaluating the predicate on the encoded data, whereby the predicate is evaluated on both the encoded data and on the encoded NULLs.

According to a further embodiment of the present invention, a system comprises: a database table having data values as well as NULLs; a dictionary table having a representation for the data values and for the NULLs; and an encoded table containing encoded representations of the data values and of the NULLs, the encoded representations having been created by using the dictionary.

According to another embodiment of the present invention, a computer program product for encoding data that includes NULLs comprises: a computer usable medium having computer usable program code embodied therewith, the computer usable program code comprising: computer usable program code configured to: encode data in a database table using a dictionary, wherein the data includes values representing NULLs; receive a query having a predicate; and evaluate the predicate on the encoded data, whereby the predicate is evaluated on both the encoded data and on the encoded NULLs.

BRIEF DESCRIPTION OF THE SEVERAL VIEWS OF THE DRAWINGS

FIG. 1 shows an uncompressed database table having a NULL;

FIG. 2 shows a table of the data in FIG. 1 after being compressed and dictionary encoded;

FIG. 3 shows a dictionary used to encode the data in FIG. 1;

FIG. 4 shows a table of compressed and dictionary encoded data in accordance with an embodiment of the invention;

FIG. 5 shows a dictionary used to encode the data shown in FIG. 4 in accordance with an embodiment of the invention;

DETAILED DESCRIPTION

Figure 6:
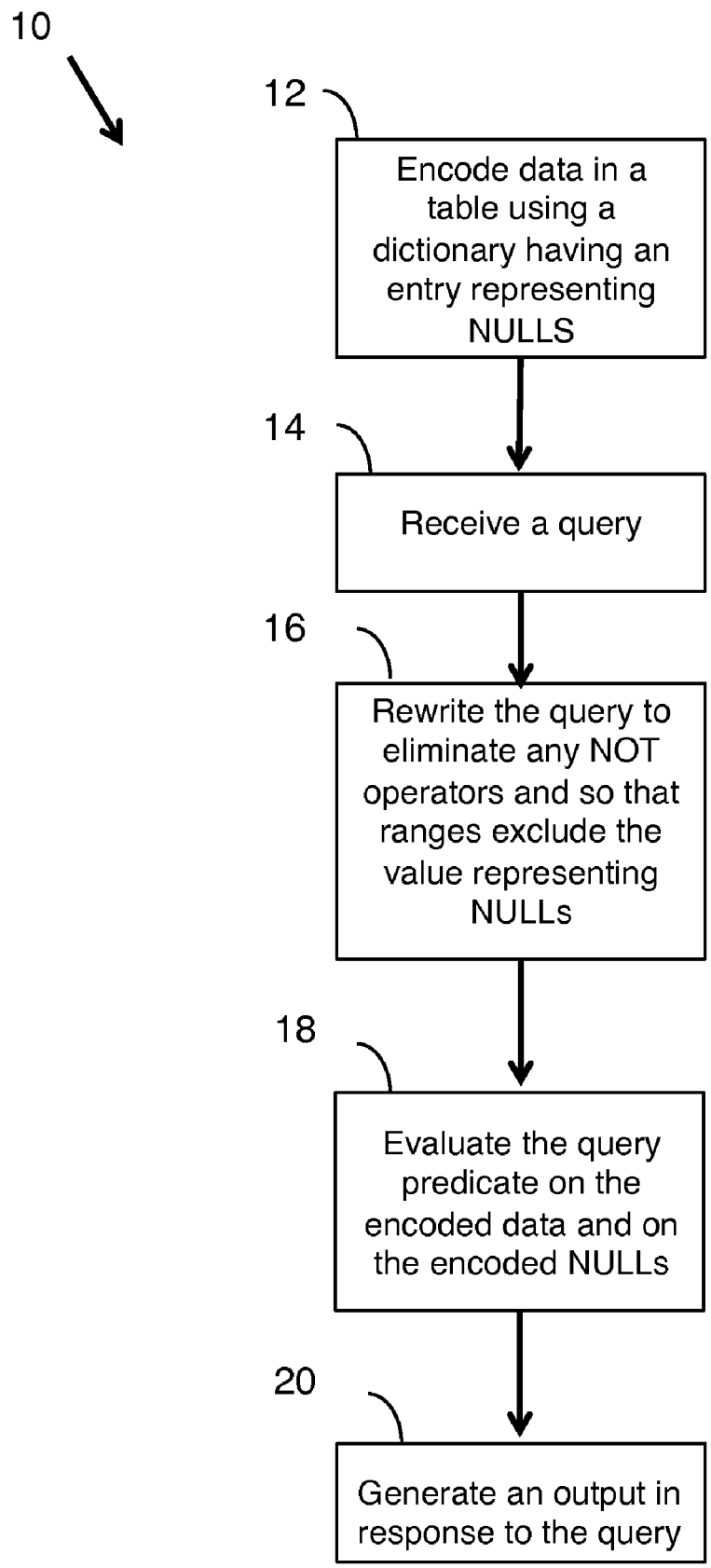
FIG. 6 shows a flowchart of a process for encoding data in accordance with an embodiment of the invention.

Embodiments of the invention provide techniques for avoiding three-valued logic in dictionary-encoded data. Current database systems introduce a special marker for each value in columns that may contain NULLs. For example, DB2 for z/OS prefixes the value of columns with a byte where '00'x means NOT NULL and 'FF'x means NULL. For varying length columns this null byte appears before the length of column.

Using this approach requires that all predicates specifically have to take care of NULLs by enhancing each predicate with the added condition "if null marker is not set". For example, consider the above-discussed query:
 SELECT *
 FROM customers
 WHERE phone_number='1-800-123-4567'
This query is executed internally in the following way:
 SELECT *
 FROM customers
 WHERE null-marker(phone_number)='00'x AND
 phone_number='1-800-123-4567'
This kind of enhanced predicate becomes necessary for any comparison operator like=, <, <=, <>, >, >=, or LIKE and NOT LIKE.

For more complex predicates such as "phone_number='1-800-123-4567' AND (salary>4 OR age<10)", the implementation is more complex and expensive, because it has to evaluate the three-value logic:

Each operator returns one of three values: true, false, or unknown (e.g., if salary is NULL for a record, "salary>4" returns unknown)

Operator logic changes as follows:
- IS NULL operator returns true if input is NULL, and false otherwise
- Non-logical operators return unknown if any input is NULL
- Logical operators compose their inputs by a three-value logic: e.g. false AND unknown=false, while false OR unknown=unknown At the SQL clause level:
- If the result of Where clause is unknown, that record is treated as failing the predicate
- COUNT (expression) accumulates 1 if the expression is not unknown and 0 otherwise
- SUM (expression) accumulates the expression if its value is not unknown and 0 otherwise
- Etc.

Dictionary encoding is a way for database systems to compress the data in a table. A dictionary (also referred to as a lookup table) is created for the data in the table, and each data value is replaced with an index into the dictionary. The data value may be quite large in size (several bytes), and the index is normally encoded with a variable amount of bits ranging from a single bit to only a few bytes (e.g. 4 bytes). Thus, an overall reduction in the data size can be achieved.

FIG. 1 shows an example of an uncompressed table, FIG. 2 shows the same table after being compressed with dictionary-encoded data. FIG. 3 shows the dictionary associated with the data in FIGS. 1 and 2. For simplicity, the table shows only a single column, while there will normally be multiple columns in an actual database table.

In current databases, NULLs are not encoded in a dictionary. Thus, the dictionary is solely used for data compression. Also, predicate evaluation is not changed, i.e. the existing predicates still have to be enhanced, as discussed above.

Row-based compression is another common compression technique. In row-based compression, the database system doesn't encode the single values of a column but handles the data of a table row as single block of data to compress without the need to know where a column starts or ends. This means that each row is just a block of binary data that can be encoded using the dictionary-based approach. Row-based compression maps commonly used subsequences of bytes to variable length coded index values.

Using this technique, the NULL indicator bytes (0x00 or 0xFF) just become additional bytes within the block of binary data. They do not have any special meaning from the perspective of compression any longer. However, the NULL indicator bytes still increase the amount of data that needs to be compressed and also increase the size of the dictionary. This leads to suboptimal results, especially if NULL and NOT NULL values are evenly distributed.

Introducing the additional predicate can be expensive, especially if the query engine processing the data is specifically tuned to avoid branching, i.e. condition-based evaluation of predicates. Examples of such tuning are query engines that take advantage of modern processors and processor-specific instructions like SIMD (single instruction, multiple data) and vector operations. Such operations work best if the processor can work without conditionally jumping through the code because each jump causes clearing and reloading the instruction pipeline.

Embodiments of the invention avoid the three-value logic completely, and deal with only true/false in the expression tree. These embodiments have three main elements. First, they take advantage of the dictionary encoding during predicate evaluation (and not only to compress the data). In contrast to prior systems, predicates are not evaluated in the domain of the values (value space) itself but rather on the dictionary-encoded, compressed data (code space). Evaluating on the compressed data allows for a transparent change in the semantics of handling NULL. Thus, NULLs can be treated like any other value in the column and dictionary-encoded, i.e. a single dictionary entry exists to represent NULLs. FIG. 4 shows an exemplary column of compressed and dictionary-encoded data. FIG. 5 shows the dictionary used in FIG. 4.

A second main element of embodiments of the invention is that the operands are rewritten for the non-logical operators (other than IS NULL) in any expression so that unknown becomes false. Specifically:
- For a range predicate on a nullable column, the operands (the bounds of the range) are rewritten so that the range excludes the NULL value (details are discussed below)
- For an equality or in-list predicate, the previous step of treating the NULLs as a dictionary entry automatically ensures that the unknown becomes false A third element of the embodiments of the invention, is to remove any NOT operators by applying DeMorgan's law. As an example, of such application, consider the predicate "NOT (age<7 AND salary>1000)". This expression is rewritten into "age>=7 OR salary<=1000". Rewriting the predicate is done because it simplifies query processing while still providing additional flexibility to the user to formulate queries.

The invention works because it ensures that any expression that would have returned "unknown" (under three-value logic) will now (after the rewrite) return "false", while expressions that would have returned "true" (respectively, "false") will still return "true" (respectively, "false"). Initially, this approach may seem to be counter-productive because an index into the dictionary usually takes up more space than a NULL indicator, which could be just a single bit (or a single byte). But there are several advantages with the present invention, which are discussed in more detail below.

One advantage is that NULL indicators may be discarded. If a simple convention is followed—like always encoding NULLs in the first dictionary entry—it is well-known that all values in code space with the first index represent NULLs and all other values are not NULL. Therefore, the NULL indicator, as discussed above, is not needed as long as the operations on the data (i.e. predicate evaluation) are applied in code space. Once the data is converted to value space by decoding it with the help of the dictionary, this distinction is lost and a NULL indicator is needed again. Thus, the information whether a value is NULL or not is encoded in code space by the actual code point in the dictionary.

In situations where the query engine uses vector operations, one goal when writing the program code will be to avoid branching in order to increase code execution. One example where the query engine uses vector operations is described in Raman et al., "Constant-Time Query Processing", Data Engineering, 2008, IEEE $24^{th}$ International Conference on Data Engineering, April 2008, pages 60-69, which is incorporated by reference in its entirety. Avoiding branching is advantageous because the instruction pipelines will not need to be reloaded, which might be the case when dealing with branches. Introducing a test such as the following example, interferes with this goal because two branches exist, and depending on the null indicator, different code branches are executed. In the example shown below, it is assumed that a simple predicate like "columnValue=123" is to be evaluated.

1. IF null indicator for the value is set THEN
2. RETURN "unknown"
3. ELSE
4. RETURN columnValue=123
5. END IF Evaluating just the statement in line 4 could be done very fast with vector operations and could also be done in parallel on multiple values. In embodiments of the invention, assuming that the index for the literal 123 into the dictionary is 9, the above predicate evaluation is changed to the following when operating on the dictionary-encoded data where NULL has its own dictionary entry.

1. RETURN encodedColumnValue=9

It is apparent that no condition to check the NULL indicator is necessary.

If, however, a predicate like "columnValue IS NULL" is to be evaluated, it can be done with the following operation—assuming that NULLs are stored as the first dictionary entry, i.e. the entry with index 1.

1. RETURN encodedColumnValue=1

Thus, testing for NULLs is not precluded by this approach.

Some systems, such as the aforementioned Raman et al. reference use dictionary-encoding for values and use an order-preserving code in the process, which means that the order of the values (when sorted) is the same in value space as it is in code space. This allows for the evaluation of range predicates in code space. For example, if a scan tries to find all values smaller than 100, and 100 has index 13 in the dictionary, the predicate on the encoded data could be expressed as:

1. RETURN encodedColumnValue<13

The storing of NULLs in the dictionary interferes here because the evaluation as shown here would now correspond to the (value space) predicate "columnValue<100 OR columnValue IS NULL". Therefore, adjustments to such range predicates must be made in order to exclude NULLs. For example:

2. RETURN encodedColumnValue<13 AND encodedColumnValue>1

Note, that even if the additional encodedColumnValue>1 needs to be implicitly added to the predicate evaluation, this approach does not cost more than having a NULL indicator, which would also need to check two conditions. The approach of the invention is even more efficient because the same data source is checked, and thus both comparisons can be performed within the same vector operation.

Table partitioning is a technique to distribute table data across multiple files in order to allow parallel processing. Table partitioning is orthogonal to dictionary encoding. One could create a common dictionary for all partitions, or each partition could have its own dictionary. Either way, encoding NULLs as described above is possible. All values with NULL are encoded and stored in the respective partition.

As discussed above, row-based compression treats a whole row as an opaque binary string. Row-based compression is orthogonal to the column-based compression discussed above. In an embodiment of the invention, it is possible to apply row-based compression on top of the dictionary-based compression for each row. In particular, first dictionary compression may be applied on each column (or just some of the columns) of the table. Then, row-based compression may be applied on the dictionary-compressed values. It is also noted that in some embodiments, dictionary-based compression may be applied to a subset of all of the columns in a table, rather than to all the columns.

The Raman et al. reference discloses building a frequency histogram in order to establish column partitions. This is done by constructing a histogram that lists each distinct value in a column and counts in how many rows this value occurs. Since NULLs are not a value (because NULL is not in the respective domain, and because NULL cannot be directly compared with other values in the column's domain), it may not be accounted for in the histogram. However, including NULLs in such a frequency histogram in the present invention allows the system to account exactly for all column values that have NULL and treat them like any other value when determining the column partitioning. Thus, NULLs may go to a separate partition, which allows the system to encode them with zero bits. Note that if we have a column partition where all values in a column are the same (e.g. NULL or some other value), it is known a priori that this single value in the column partition does not have to be encoded at all. The value can be inferred from the meta data of the column partition already. Thus, we need no storage (0 bits) for the information.

Database systems like DB2 provide aggregate functions that combine a set of values and compute a single value. For example, the average or the sum of all (or just a part) of the values in a column can be computed. If the aggregation can be performed in code space using the teaching of the invention, then NULLs may have an influence here, as well. An aggregation "COUNT (columnValue)", which counts all the non-NULL values in the column, has to be rewritten to "SUM (CASE WHEN encodedColumnValue=1 THEN 0 ELSE 1 END)". More generally, "SUM (expression)" is rewritten as "SUM (case when is null (expression) then 0 else 1 end)"

FIG. 6 is a flowchart of a process 10 for encoding data containing NULLs without using three-valued logic. In block 12, data is encoded in a table using a dictionary having an entry representing NULLs. In block 14, a query is received. The query may be rewritten so as to eliminate NOT operators and so that ranges exclude the value representing NULLs, in block 16. In block 18, the query predicate is evaluated on the encoded data and on the encoded NULLs. In block 20, an output to the query is generated.

As can be seen from the above disclosure, embodiments of the invention provide techniques for encoding data containing NULLs without using three-valued logic. As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, the present invention may take the form of a computer program product embodied in any tangible medium of expression having computer usable program code embodied in the medium. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note, that the computer-usable or computer-readable medium could even be paper or another suitable medium upon which the program is printed, as the program can be electronically captured, for instance, via optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wire line, optical fiber cable, RF, etc.

Computer program code for carrying out operations of the present invention may be written in any combination of one or more programming languages, including an object oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 7:
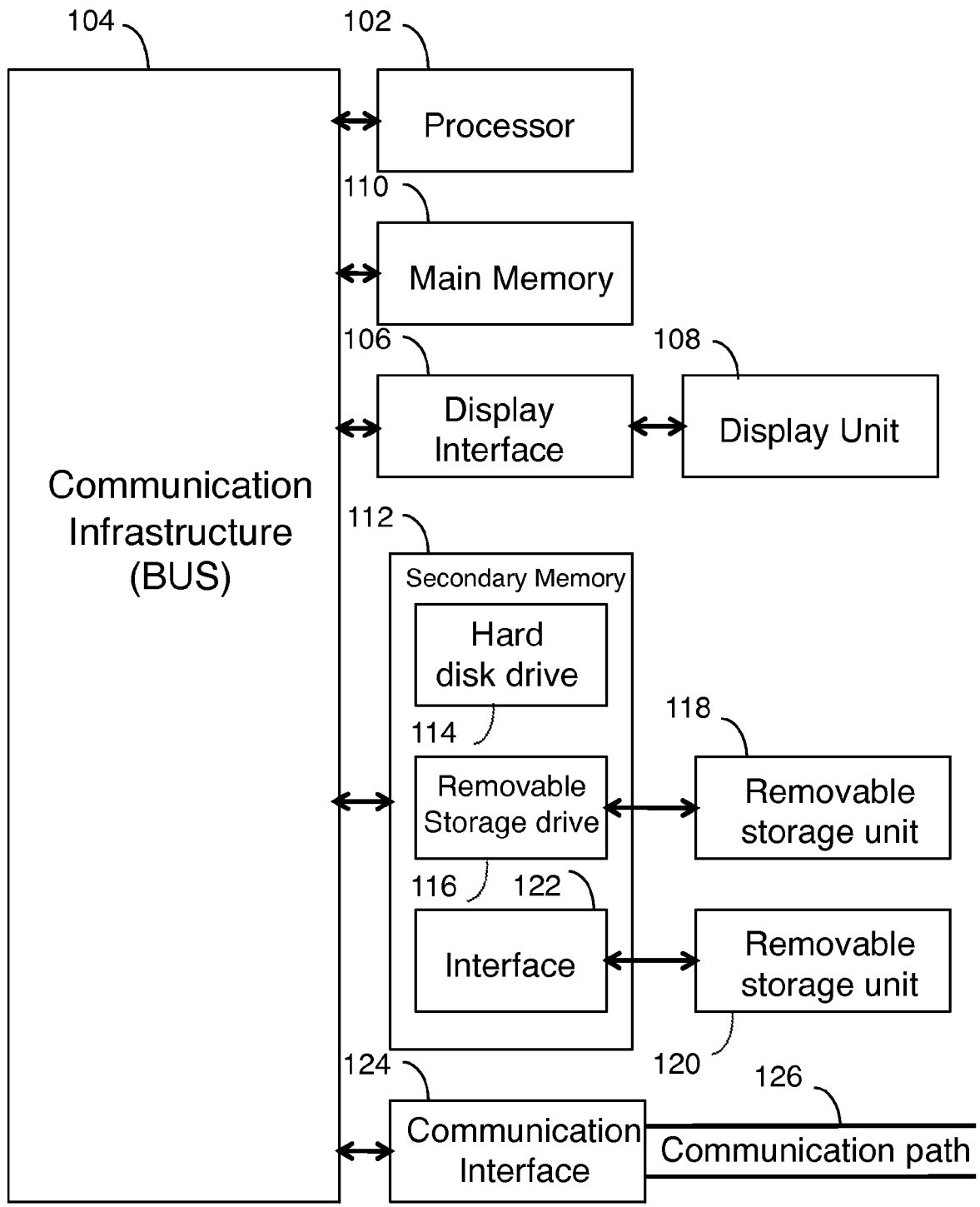
FIG. 7 shows a high level block diagram of an information processing system useful for implementing one embodiment of the present invention.

FIG. 7 is a high level block diagram showing an information processing system useful for implementing one embodiment of the present invention. The computer system includes one or more processors, such as processor 102. The processor 102 is connected to a communication infrastructure 104 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 106 that forwards graphics, text, and other data from the communication infrastructure 104 (or from a frame buffer not shown) for display on a display unit 108. The computer system also includes a main memory 110, preferably random access memory (RAM), and may also include a secondary memory 112. The secondary memory 112 may include, for example, a hard disk drive 114 and/or a removable storage drive 116, representing, for example, a floppy disk drive, a magnetic tape drive, or an optical disk drive. The removable storage drive 116 reads from and/or writes to a removable storage unit 118 in a manner well known to those having ordinary skill in the art. Removable storage unit 118 represents, for example, a floppy disk, a compact disc, a magnetic tape, or an optical disk, etc. which is read by and written to by removable storage drive 116. As will be appreciated, the removable storage unit 118 includes a computer readable medium having stored therein computer software and/or data.

In alternative embodiments, the secondary memory 112 may include other similar means for allowing computer programs or other instructions to be loaded into the computer system. Such means may include, for example, a removable storage unit 120 and an interface 122. Examples of such means may include a program cartridge and cartridge interface (such as that found in video game devices), a removable memory chip (such as an EPROM, or PROM) and associated socket, and other removable storage units 120 and interfaces 122 which allow software and data to be transferred from the removable storage unit 120 to the computer system.

The computer system may also include a communications interface 124. Communications interface 124 allows software and data to be transferred between the computer system and external devices. Examples of communications interface 124 may include a modem, a network interface (such as an Ethernet card), a communications port, or a PCMCIA slot and card, etc. Software and data transferred via communications interface 124 are in the form of signals which may be, for example, electronic, electromagnetic, optical, or other signals capable of being received by communications interface 124. These signals are provided to communications interface 124 via a communications path (i.e., channel) 126. This communications path 126 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 110 and secondary memory 112, removable storage drive 116, and a hard disk installed in hard disk drive 114.

Computer programs (also called computer control logic) are stored in main memory 110 and/or secondary memory 112. Computer programs may also be received via communications interface 124. Such computer programs, when executed, enable the computer system to perform the features of the present invention as discussed herein. In particular, the computer programs, when executed, enable the processor 102 to perform the features of the computer system. Accordingly, such computer programs represent controllers of the computer system.

From the above description, it can be seen that the present invention provides a system, computer program product, and method for implementing the embodiments of the invention. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
    providing a dictionary containing a plurality of predefined codes, wherein the plurality of predefined codes includes a first predefined code representing a null value, wherein the first predefined code is not a null value;
    encoding data in a database table using the dictionary, wherein the data includes at least one null value, wherein encoding the data results in the at least one null value being encoded as the first predefined code;
    receiving a query having a predicate;
    rewriting the query based on the received query, the data dictionary, and one or more predicate generation rules, wherein the rewritten query excludes any three-valued logic; and
    evaluating, by operation of one or more computer processors, the rewritten query against the encoded data, whereby the rewritten query is evaluated on at least the first predefined code, wherein the encoded data is evaluated without decoding the encoding data.

2. The computer-implemented method of claim 1, wherein a first predicate generation rule comprises:
    if the predicate is a range predicate, rewriting the bounds of the range of the range predicate so as to exclude the first predefined code.

3. The computer-implemented method of claim 2, wherein a second predicate generation rule comprises:
    if the predicate includes a NOT operator, rewriting the predicate into an equivalent expression that does not contain a NOT expression.

4. The computer-implemented method of claim 1, wherein the encoding compresses the data.

5. The computer-implemented method of claim 4, wherein the encoding stores multiple encoded fields of each record together in a row-major fashion.

6. The computer-implemented method of claim 1, wherein the encoding is a dictionary-based compression.

7. The computer-implemented method of claim 6, wherein the first predefined code appears on the same table location in a plurality of dictionaries.

8. The computer-implemented method of claim 1, wherein the database table does not have a null value indicator.

9. A computer program product for encoding data including NULLs, the computer program product comprising:
    a computer usable medium having computer readable program code embodied therewith, the computer readable program code comprising:
    computer readable program code configured to:
        provide a dictionary containing a plurality of predefined codes, wherein the plurality of predefined codes includes a first predefined code representing a null value, wherein the first predefined code is not a null value;
        encode data in a database table using the dictionary, wherein the data includes at least one null value, wherein encoding the data results in the at least one null value being encoded as the first predefined code;
        receive a query having a predicate;
        generate rewriting the query based on the received query, the data dictionary, and one or more predicate generation rules, wherein the rewritten query excludes any three-valued logic; and
        evaluate the rewritten query against the encoded data, whereby the rewritten query is evaluated on at least the first predefined code, wherein the encoded data is evaluated without decoding the encoding data.

10. The computer program product of claim 9, wherein a first predicate generation rule comprises:
   if the predicate is a range predicate, rewriting the bounds of the range of the range predicate so as to exclude the first predefined code.

11. The computer program product of claim 10, wherein a second predicate generation rule comprises:
   if the predicate includes a NOT operator, rewriting the predicate into an equivalent expression that does not contain a NOT expression.

12. The computer program product of claim 9, wherein the encoding compresses the data.

* * * * *